United States Patent
Kim et al.

(10) Patent No.: US 7,045,445 B2
(45) Date of Patent: May 16, 2006

(54) METHOD FOR FABRICATING SEMICONDUCTOR DEVICE BY USING PECYCLE-CVD PROCESS

(75) Inventors: Young Gi Kim, Daejeon (KR); Sang Ho Woo, Kyoungki-do (KR); Seung Won Choi, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 357 days.

(21) Appl. No.: 10/740,139

(22) Filed: Dec. 18, 2003

(65) Prior Publication Data

US 2004/0224502 A1    Nov. 11, 2004

(30) Foreign Application Priority Data

May 9, 2003    (KR) .................. 10-2003-0029316

(51) Int. Cl.
*H01L 21/20*    (2006.01)
*H01L 21/44*    (2006.01)

(52) U.S. Cl. .................. 438/485; 438/674; 438/680

(58) Field of Classification Search ............ None
See application file for complete search history.

(56) References Cited

U.S. PATENT DOCUMENTS

| 5,052,339 | A | * | 10/1991 | Vakerlis et al. | .......... 118/723 E |
| 5,879,973 | A | * | 3/1999 | Yanai et al. | ................ 438/161 |
| 6,139,700 | A | | 10/2000 | Kang et al. | |
| 6,167,834 | B1 | | 1/2001 | Wang et al. | |
| 6,189,482 | B1 | | 2/2001 | Zhao et al. | |
| 6,444,587 | B1 | | 9/2002 | Lin et al. | |
| 6,461,970 | B1 | | 10/2002 | Yin | |
| 6,509,280 | B1 | | 1/2003 | Choi | |
| 6,531,389 | B1 | | 3/2003 | Shue et al. | |
| 6,616,987 | B1 | * | 9/2003 | Morfill et al. | .............. 427/569 |
| 2005/0242061 | A1 | * | 11/2005 | Fukuda | .................. 216/67 |

FOREIGN PATENT DOCUMENTS

| JP | 06-122978 | 5/1994 |
| JP | 11-343574 | 12/1999 |
| JP | 2002-100574 | 4/2002 |

* cited by examiner

*Primary Examiner*—Ngân V. Ngô
(74) *Attorney, Agent, or Firm*—Ladas & Parry LLP

(57) ABSTRACT

Disclosed is a method for fabricating a semiconductor device by using a PECYCLE-CVD process. The method includes the steps of feeding source gas into a process chamber for predetermined time within one cycle, allowing reaction gas to flow in the process chamber at least until a plasma reaction is finished in the process chamber and feeding purge gas into the process chamber for a predetermined time within one cycle, thereby purging residual products remaining in the process chamber after source gas is reacted, forming plasma in the process chamber for a predetermined time within one cycle so as to allow reaction gas to react with plasma, thereby depositing a thin film on a wafer, and feeding purge gas into the process chamber for a predetermined time within one cycle, thereby purging residual products remaining in the process chamber after reaction gas is reacted. Superior step-coverage and uniformity of the thin film are achieved while depositing the thin film at a higher speed.

9 Claims, 8 Drawing Sheets

METHOD FOR FABRICATING SEMICONDUCTOR DEVICE BY USING PECYCLE-CVD PROCESS

BACKGROUND OF THE INVENTION

1. Field of the Invention

The present invention relates to a method for fabricating a semiconductor device, and more particularly to a method for fabricating a semiconductor device by using a PECYCLE-CVD (plasma enhanced cycle chemical vapor deposition) process.

2. Description of the Prior Art

Various semiconductor thin film deposition techniques including a CVD (chemical vapor deposition), a PECVD (plasma enhanced chemical vapor deposition), an ALD (atomic layer deposition), and a PEALD (plasma enhanced chemical vapor deposition) are well known in the art. However, they have disadvantages when depositing thin films for highly integrated semiconductor devices.

Hereinafter, various problems occurring in the conventional semiconductor thin film depositing techniques will be described with reference to FIGS. 1 to 12.

Figure 1:
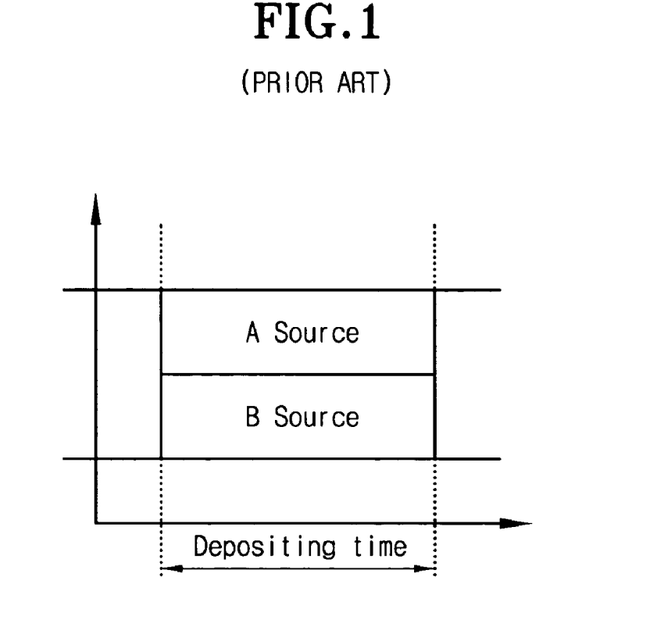
FIG. 1 is a view showing a deposition step of a conventional CVD process.
Figure 2:
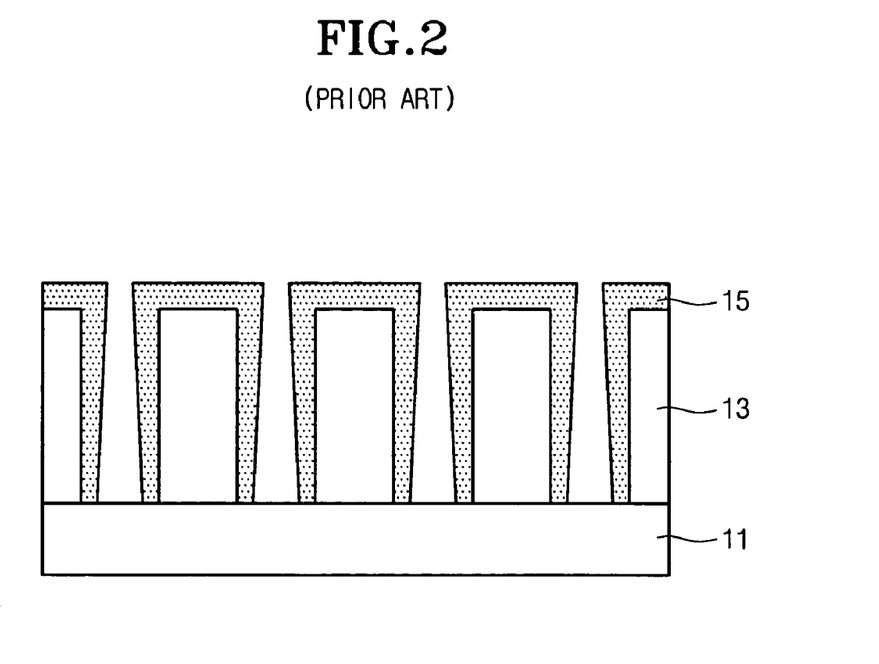
FIG. 2 is a sectional view showing a step-coverage of a thin film deposited through a conventional CVD process.
Figure 3A:
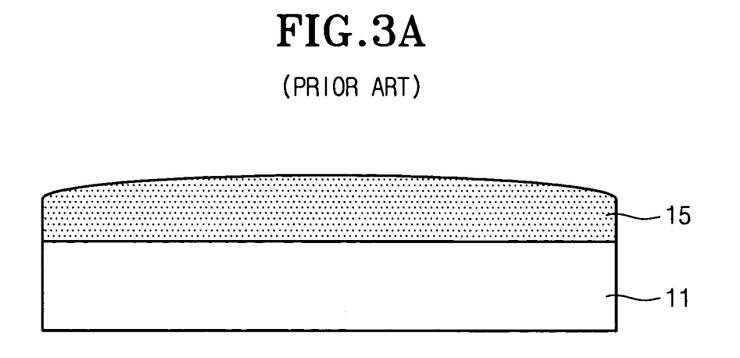
FIGS. 3a and 3b are sectional view showing a uniformity of a thin film deposited through a conventional CVD process.
Figure 3B:
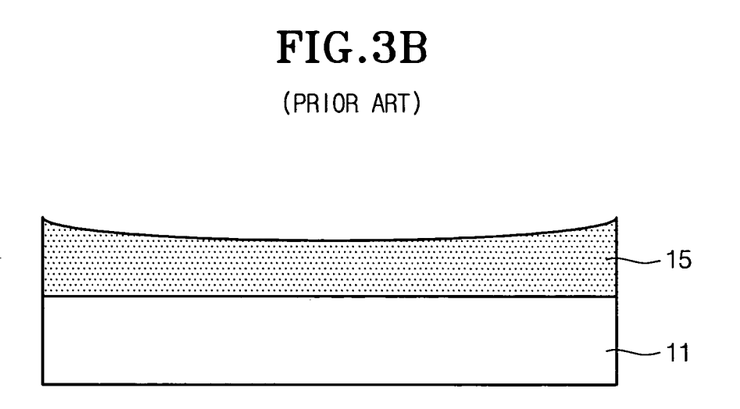

As shown in FIG. 1, according to a conventional CVD process, first source gas A and second source gas B are fed into a process chamber while the CVD process is being carried out in such a manner that a MO-source thin film 15 is deposited on a wafer through a chemical-vapor reaction between the first and second source gases A and B. In this case, not only is it difficult to control the gas and source, but also a lower layer is damaged due to a high process temperature, so that a process window is narrowed when depositing the semiconductor thin film. In addition, as shown in FIGS. 2, 3a and 3b, the step coverage and film uniformity become deteriorated, so that the conventional CVD process is not adaptable for achieving a micro-structure of a highly integrated memory device.

Figure 4:
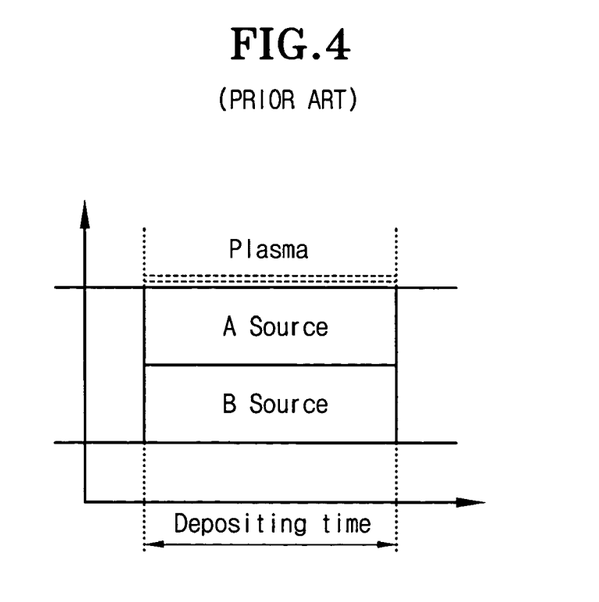
FIG. 4 is a view showing a deposition step of a conventional PECVD process.
Figure 5:
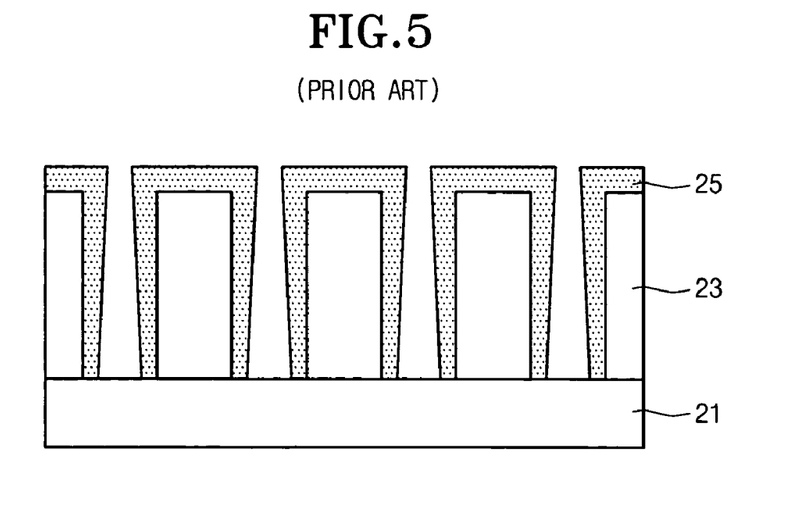
FIG. 5 is a sectional view showing a step-coverage of a thin film deposited through a conventional PECVD process.
Figure 6A:
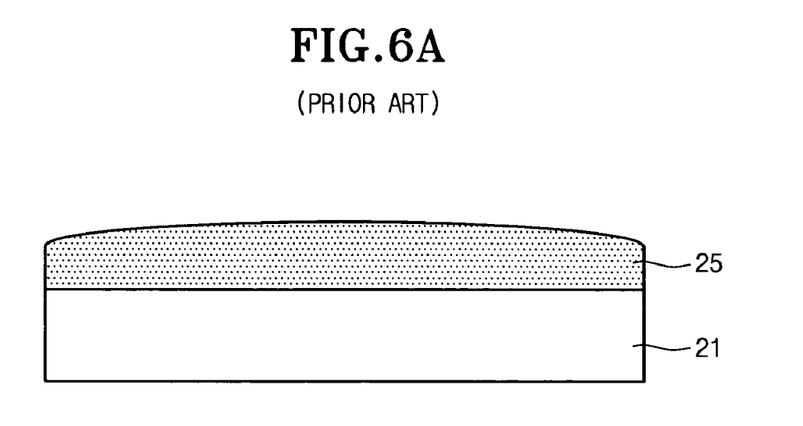
FIGS. 6a and 6b are sectional view showing a uniformity of a thin film deposited through a conventional PECVD process.
Figure 6B:
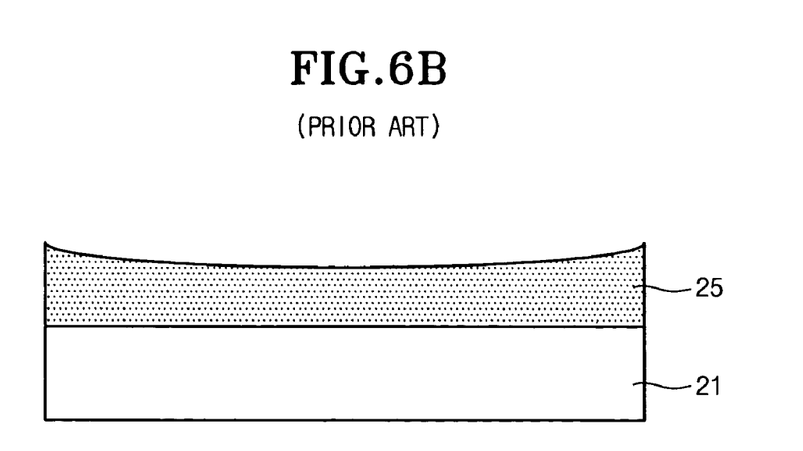

In addition, according to a conventional PECVD process as shown in FIG. 4, first and second source gases A and B and plasma are fed into a process chamber while the PECVD process is being carried out in such a manner that a thin film 25 is deposited on a wafer through a chemical-vapor reaction between source gases A and B and plasma. However, the PECVD process also makes it difficult to control the gas and source. Although the PECVD process is carried out at a temperature lower than a temperature of the CVD process, the step coverage and film uniformity still become deteriorated as shown in FIGS. 6a and 6b, so that the conventional PECVD process is not adaptable for achieving a micro-structure of a highly integrated memory device.

Figure 7:
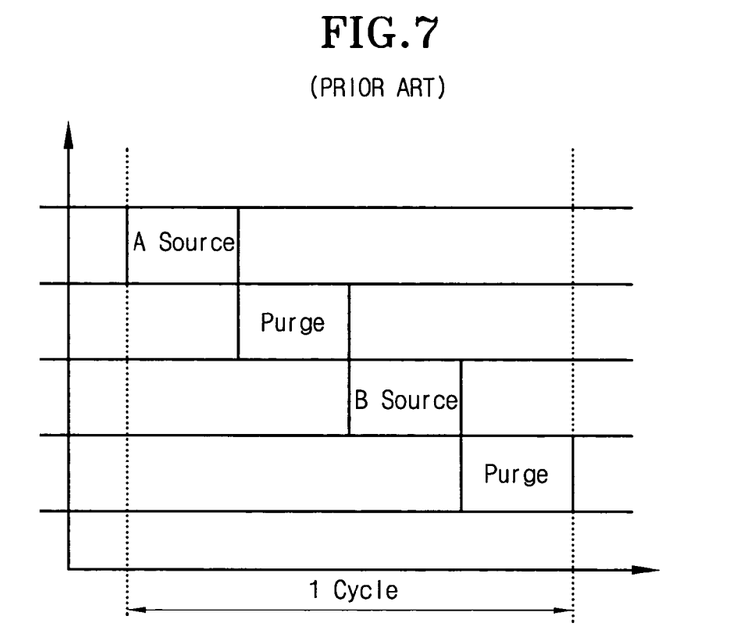
FIG. 7 is a view showing a deposition step of a conventional ALD process.
Figure 8:
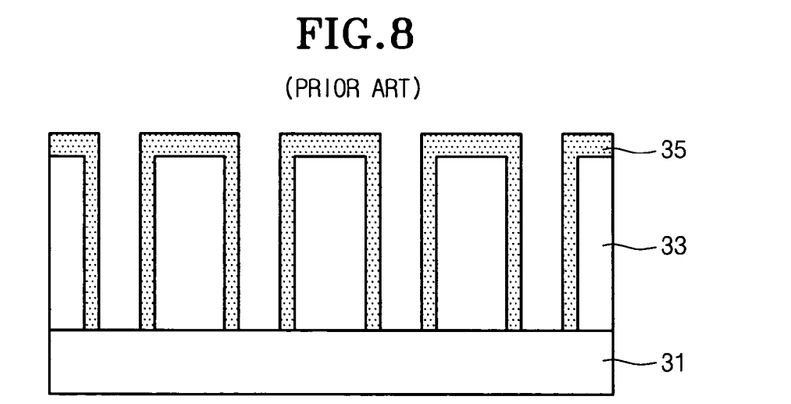
FIG. 8 is a sectional view showing a step-coverage of a thin film deposited through a conventional ALD process.
Figure 9:
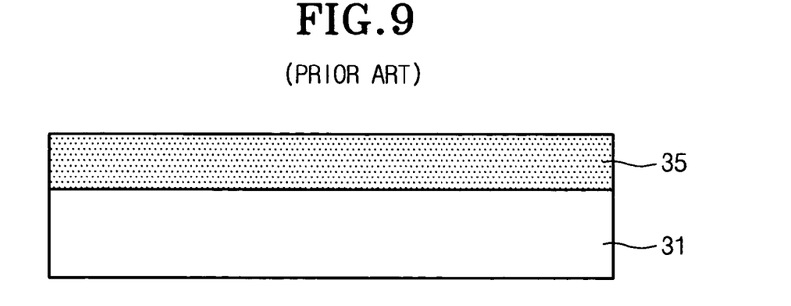
FIG. 9 is a sectional view showing a uniformity of a thin film deposited through a conventional ALD process.

FIG. 7 shows a conventional ALD process. According to the conventional ALD process, a first purge process is carried out after first source gas A has been fed into a process chamber. Then, second source gas is fed into the process chamber and a second purge process is carried out, thereby forming a thin film, such as a Mo source thin film 35. As shown in FIGS. 8 and 9, the ALD process can easily control gas and source and achieve superior step coverage and film uniformity. However, since the ALD process has a low deposition speed, it is adaptable only for depositing a thin film. In addition, the ALD process has a disadvantage when fabricating semiconductor devices in mass-production.

Figure 10:
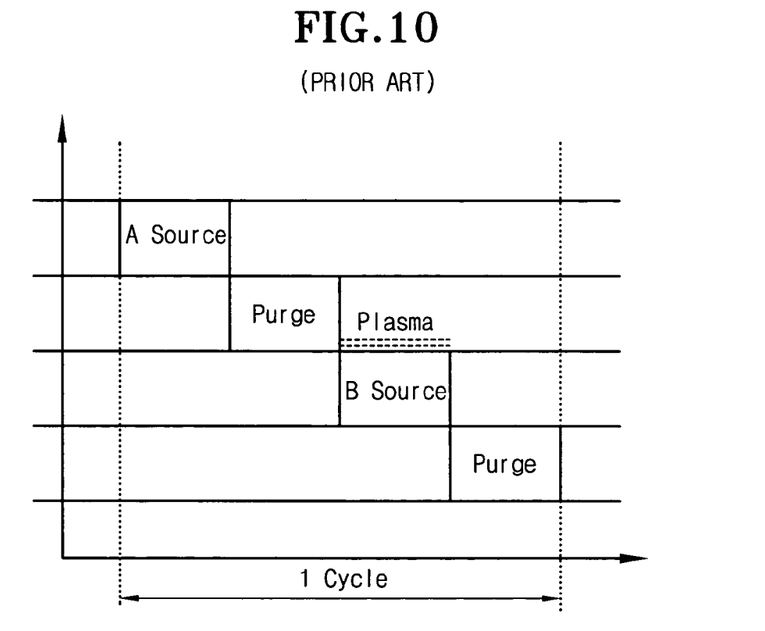
FIG. 10 is a view showing a deposition step of a conventional PEALD process.
Figure 11:
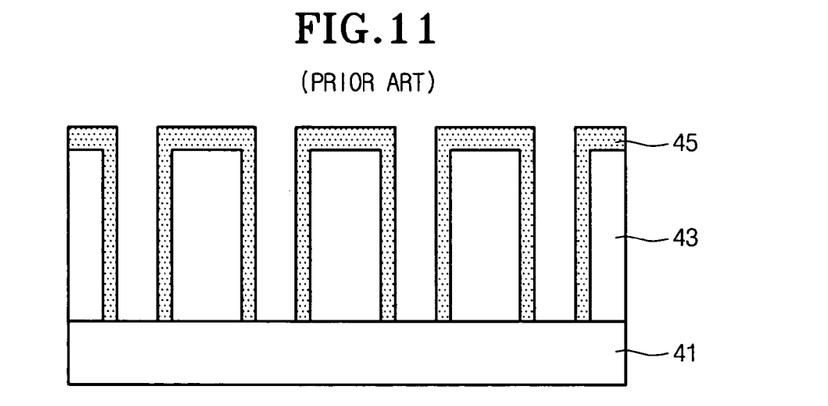
FIG. 11 is a sectional view showing a step-coverage of a thin film deposited through a conventional PEALD process.
Figure 12:
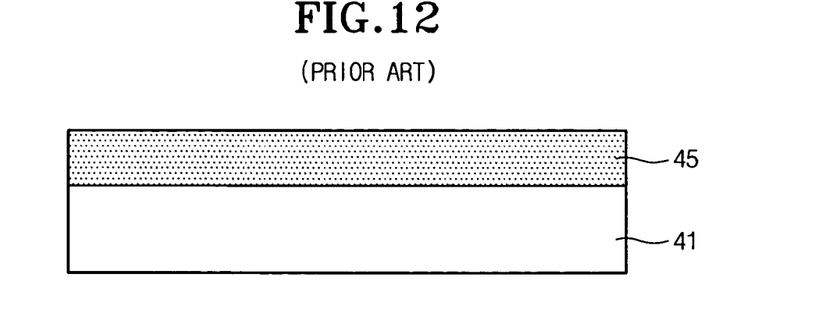
FIG. 12 is a sectional view showing a uniformity of a thin film deposited through a conventional PEALD process.

FIG. 10 shows a conventional PEALD process. According to the conventional PEALD process, a first purge process is carried out after first source A has been fed into a process chamber. Then, second source gas B is fed into the process while generating plasma in the process chamber. After that, a second purge process is carried out, thereby forming a thin film, such as a Mo source thin film 45. As shown in FIGS. 11 and 12, the PEALD process can easily control gas and source and achieve superior step coverage and film uniformity. However, since the PEALD process also has a low deposition speed, it is just adaptable for depositing a thin film. In addition, although the PEALD process may solve problems of the ALD process, the PEALD process also has a disadvantage when fabricating semiconductor devices in mass-production.

SUMMARY OF THE INVENTION

Accordingly, the present invention has been made to solve the above-mentioned problems occurring in the prior art, and an object of the present invention is to provide a method for fabricating a semiconductor device by using a PECYLE-CVD process, capable of achieving superior step coverage and uniformity of a thin film and capable of depositing the thin film at a higher speed.

In order to accomplish this object, there is provided a method for fabricating a semiconductor device by using a PECYCLE-CVD process, the method comprising the steps of: feeding source gas into a process chamber for a predetermined time within one cycle; allowing reaction gas to flow in the process chamber at least until a plasma reaction is finished in the process chamber and feeding purge gas into the process chamber for a predetermined time within one cycle, thereby purging residual products remaining in the process chamber after source gas is reacted; forming plasma in the process chamber for a predetermined time within one cycle so as to allow reaction gas to react with plasma, thereby depositing a thin film on a wafer; and feeding purge gas into the process chamber for predetermined time within one cycle, thereby purging residual products remaining in the process chamber after reaction gas is reacted.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a method for fabricating a semiconductor device by using a PECYCLE-CVD process according to a preferred embodiment of the present invention will be described with reference to the accompanying drawings. In the following description and drawings, the same reference numerals are used to designate the same or similar components, and so repetition of the description on the same or similar components will be omitted.

Figure 13:
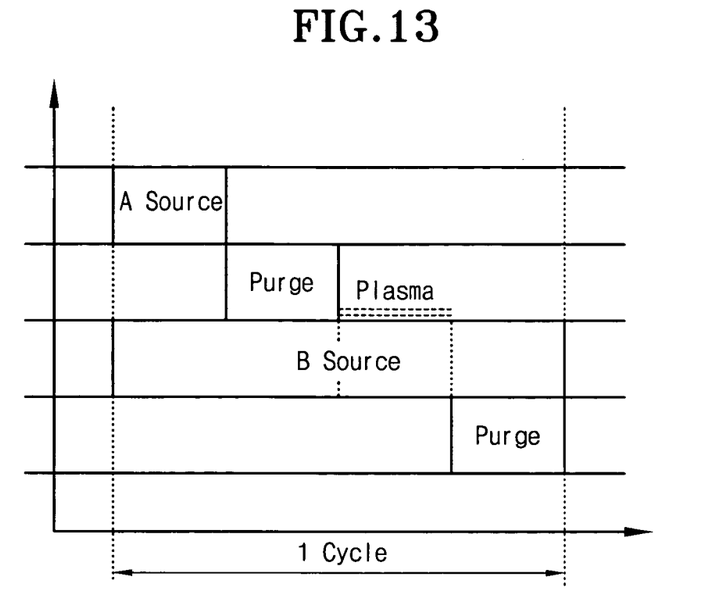
FIG. 13 is a view showing a deposition step of a PECYCLE-CVD process according to one embodiment of the present invention.
Figure 14:
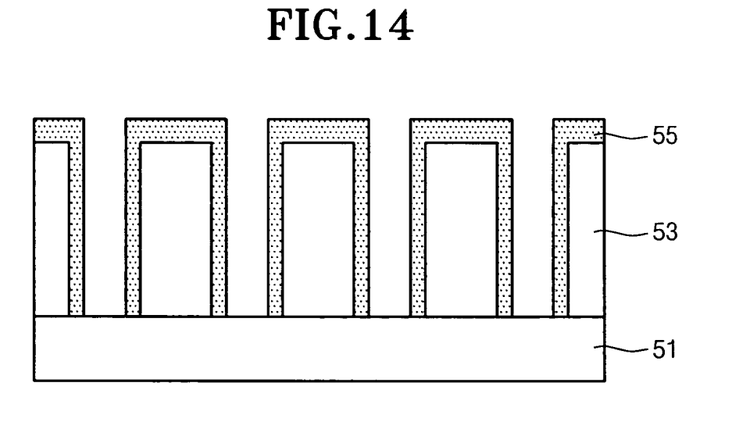
FIG. 14 is a sectional view showing a step-coverage of a thin film deposited through a PECYCLE-CVD process according to one embodiment of the present invention.
Figure 15:
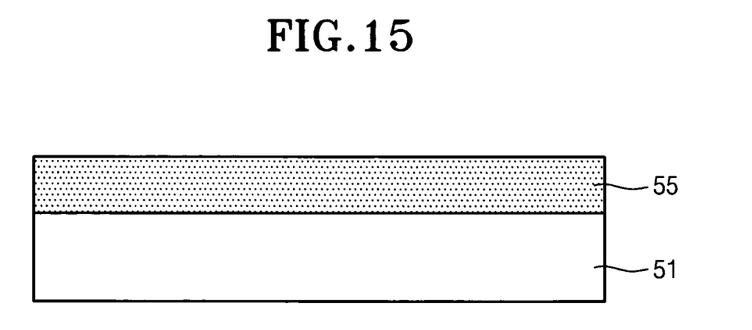
FIG. 15 is a sectional view showing a uniformity of a thin film deposited through a PECYCLE-CVD process according to one embodiment of the present invention.

FIG. 13 is a view showing a deposition step of a PECYCLE-CVD process according to one embodiment of the present invention, FIG. 14 is a sectional view showing a step-coverage of a thin film deposited through the PECYCLE-CVD process according to one embodiment of the present invention, and FIG. 15 is a sectional view showing a uniformity of the thin film deposited through the PECYCLE-CVD process according to one embodiment of the present invention.

Figure 16:
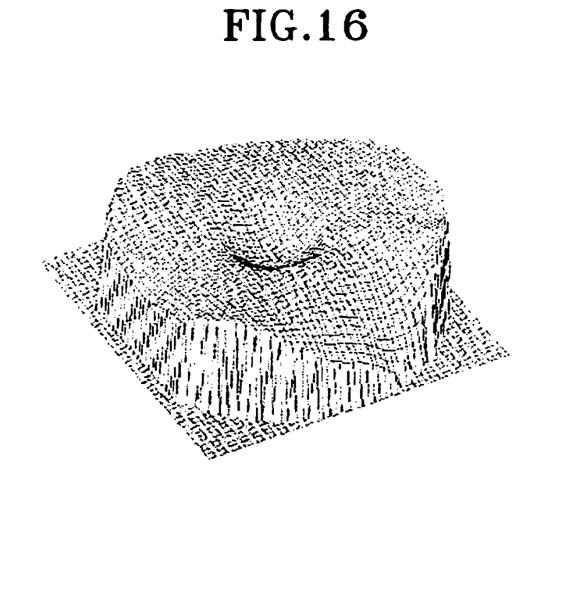
FIG. 16 is a TEM picture showing thickness and uniformity of a thin film deposited through a PECYCLE-CVD process according to one embodiment of the present invention.
Figure 17:
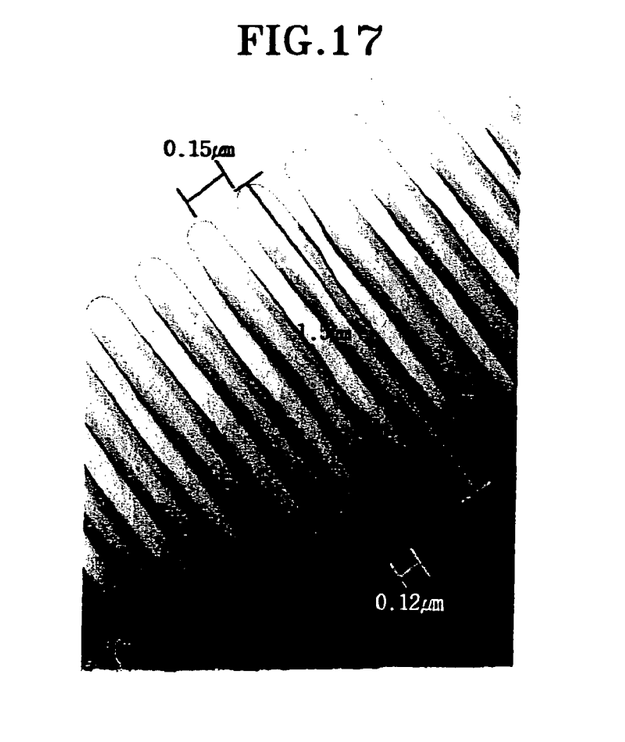
FIG. 17 is a TEM picture showing a thin film deposited through a PECYCLE-CVD process according to one embodiment of the present invention.
Figure 18:
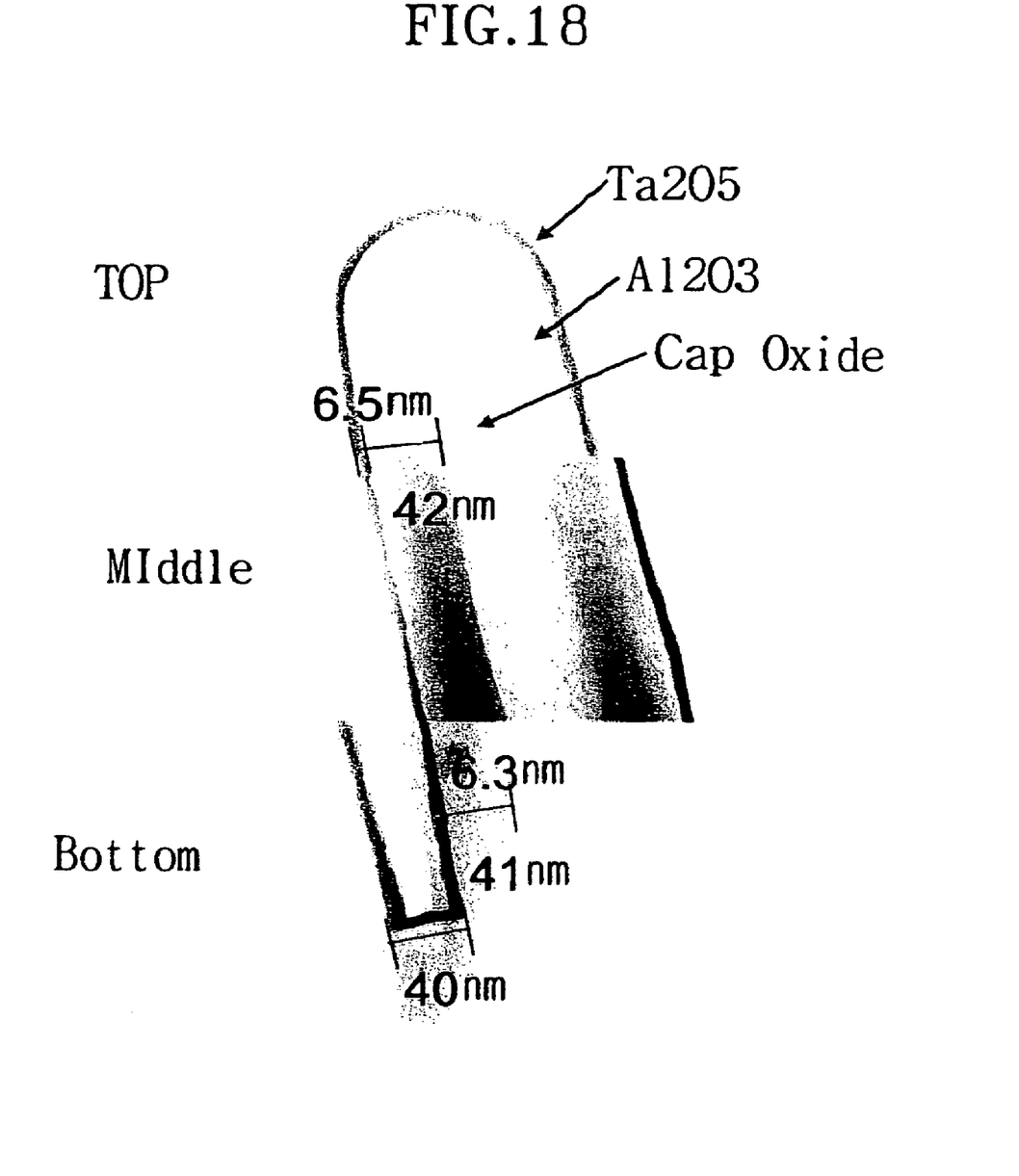
FIG. 18 is an enlarged view of a part of a TEM picture shown in FIG. 17.

In addition, FIG. 16 is a TEM picture showing thickness and uniformity of the thin film deposited through the PECYCLE-CVD process according to one embodiment of the present invention, FIG. 17 is a TEM picture showing the thin film deposited through the PECYCLE-CVD process according to one embodiment of the present invention, and FIG. 18 is an enlarged view of a part of the TEM picture shown in FIG. 17.

As shown in FIG. 13, according to the method for fabricating the semiconductor device by using the PECYCLE CVD process of the present invention, source gas A is fed into a process chamber (not shown) having a silicon wafer 51 therein for predetermined time within one cycle. Source gas A is one selected from the group consisting of $Ta_2O_5$, $Al_2O$, $HfO_2$, Ru, BST, SB, Pt, TiN, Ti, and $TiO_2$. One cycle means deposition time for a thin film.

Then, primary purge gas is fed into the process chamber for predetermined time within one cycle, such that residual products remaining in the process chamber after source gas has been reacted can be purged by primary purge gas.

After that, reaction gas B is fed into the process chamber for one cycle, or reaction gas B is fed into the process chamber at least until a plasma reaction has been finished in the process chamber, that is, at least until secondary purge gas is introduced into the process chamber. In this state, plasma is generated in the process chamber for predetermined time within one cycle so as to absorb reaction gas. At this time, reaction gas B includes at least one selected from the group consisting of $N_2$, $O_2$, $H_2$, $NH_3$, $N_2O$, cyclo-alkane such as $C_xH_{(2x)}$, and gas such as $C_xH_{(2x+2)}$, in which at least a part of alkane is replaced with F or Cl. In addition, inert gas, such as He, Ne, Ar, Xe, and Kr, is added to reaction gas. When forming plasma in the process chamber, plasma power is adjusted below 1000 W. In addition, when forming the thin film, pressure of the process chamber is below atmospheric pressure, a substrate temperature is about 50 to 800° C., and plasma reaction time is set in a range about 0.01 to 180 seconds.

Then, purge gas is fed into the process chamber for predetermined time within one cycle so as to allow reaction gas B to be reacted with purge gas and to purge residual products remaining in the process chamber. At this time, purge time is set within 60 seconds.

The thin film deposition process for fabricating the semiconductor device is achieved through performing the above cycle.

According to the present invention, a Mo source thin film 55 is deposited on a wafer through the above PECYCLE-CVD process by allowing reaction gas to rapidly react with plasma and to be securely absorbed on the wafer.

FIGS. 16 to 18 show a TEM picture representing the thickness and uniformity of the thin film formed through the PECYCLE-CVD process according to one embodiment of the present invention.

Referring to FIG. 16, a thickness of a target is about 100 Å, a mean thickness of the thin film is about 100.56 Å, and the uniformity of the thin film is about 0.76%.

Referring to FIGS. 17 and 18, when an $Al_2O_3$ layer and a $Ta_2O_5$ layer are sequentially deposited on a cap oxide layer, an aspect ratio thereof is about 12.5:1, a step-coverage of the $Al_2O_3$ layer is about 97.6, and a step-coverage of the $Ta_2O_5$ layer is about 96.9.

According to another embodiment of the present invention, the Mo source thin film formed through the PECYCLE-CVD process of the present invention can be used as a part of a lower electrode or an upper electrode of concave-type, cylinder type and stack-type capacitors. When the thin film formed through the PECYCLE-CVD process of the present invention is applied to the capacitor, SBT, PZT, BLT, BST, ST or a tantalum oxide layer is selectively used as a dielectric layer of the capacitor.

As described above, according to the method for fabricating the semiconductor device by using the PECYCLE-CVD process, reaction gas reacted with plasma is securely and rapidly absorbed into the wafer, thereby depositing the Mo source thin film on the wafer. In addition, the deposition process is carried out in a reduction atmosphere with a low-temperature, a lower layer is prevented from being oxidized. In addition, since the thin film is deposited through the PECYCLE-CVD process, superior step-coverage and uniformity of the thin film can be achieved, while improving the deposition speed and productivity. Identical to the ALD and PEALD processes, the PECYCLE-CVD process of the present invention can control gases and sources when depositing the thin film.

In addition, since the PECYCLE-CVD process of the present invention includes advantages of the ALD and PEALD processes, it can be advantageously used for depositing the thin film of future semiconductor devices.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device by using a PECYCLE-CVD process, the method comprising the steps of:
   i) feeding source gas into a process chamber for predetermined time within one cycle;
   ii) allowing reaction gas to flow in the process chamber at least until a plasma reaction is finished in the process chamber and feeding purge gas into the process chamber for a predetermined time within one cycle, thereby purging residual products remaining in the process chamber after source gas is reacted;
   iii) forming plasma in the process chamber for a predetermined time within one cycle so as to allow reaction gas to react with plasma, thereby depositing a thin film on a wafer; and
   iv) feeding purge gas into the process chamber for a predetermined time within one cycle, thereby purging residual products remaining in the process chamber after reaction gas is reacted.

2. The method as claimed in claim 1, wherein reaction gas is continuously fed into the process chamber while one cycle is being carried out.

3. The method as claimed in claim 1, wherein source gas is one selected from the group consisting of $Ta_2O_5$, $Al_2O$, $HfO_2$, Ru, BST, SB, Pt, TiN, Ti, and $TiO_2$.

4. The method as claimed in claim 1, wherein reaction gas includes at least one selected from the group consisting of $N_2$, $O_2$, $H_2$, $NH_3$, $N_2O$, cyclo-alkane such as $C_xH_{(2x)}$, and gas such as $C_xH_{(2x+2)}$, in which at least a part of alkane is replaced with F or Cl.

5. The method as claimed in claim 1, wherein inert gas selected from the group consisting of He, Ne, Ar, Xe, and Kr is added to the reaction gas.

6. The method as claimed in claim 1, wherein plasma power is adjusted below 1000 W when forming plasma.

7. The method as claimed in claim 1, wherein, when forming the thin film, pressure of the process chamber is below atmospheric pressure, a substrate temperature is about 50 to 800° C., and a plasma reaction time is set in a range about 0.01 to 180 seconds.

8. The method as claimed in claim 1, wherein, when forming the thin film, a purge time for purging source gas or reaction gas is set within 60 seconds.

9. The method as claimed in claim 1, wherein the thin film includes a Mo source thin film.

* * * * *